(12) United States Patent
Corman

(10) Patent No.: US 6,548,130 B1
(45) Date of Patent: Apr. 15, 2003

(54) FIBER COATING METHOD

(75) Inventor: Gregory Scot Corman, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 283 days.

(21) Appl. No.: 09/665,274

(22) Filed: Sep. 19, 2000

Related U.S. Application Data

(62) Division of application No. 09/385,843, filed on Aug. 30, 1999, now Pat. No. 6,168,827.

(51) Int. Cl.⁷ .................. C23C 16/00; B65H 81/00; B32B 7/06
(52) U.S. Cl. .................. 428/34.1; 428/36.3; 428/36.91; 428/408; 428/906; 156/171; 156/189; 242/444.5; 118/728
(58) Field of Search ................. 428/36.3, 35.7, 428/36.91, 906, 34.1, 408; 156/171, 184, 189; 242/444.5; 118/728

(56) References Cited

U.S. PATENT DOCUMENTS

| | | | |
|---|---|---|---|
| 3,788,918 A | 1/1974 | Poulsen | |
| 4,041,116 A | 8/1977 | Baud et al. | |
| 4,682,594 A | 7/1987 | Mok | |
| 4,863,760 A | 9/1989 | Schantz et al. | |
| 5,048,441 A | * 9/1991 | Quigley | 114/90 |
| 5,116,679 A | 5/1992 | Nadkarni et al. | |
| 5,459,114 A | 10/1995 | Kaya et al. | |
| 5,599,242 A | * 2/1997 | Solviche et al. | 273/DIG. 23 |
| 5,695,830 A | 12/1997 | Larnac et al. | |
| 5,904,957 A | 5/1999 | Christin et al. | |
| 6,129,962 A | * 10/2000 | Quigley et al. | 428/36.1 |
| 6,168,827 B1 | * 1/2001 | Corman | 156/171 |

* cited by examiner

Primary Examiner—Rena Dye
(74) Attorney, Agent, or Firm—Noreen C. Johnson; Christian G. Cabou

(57) ABSTRACT

A coating is applied to reinforcing fibers arranged into a tow by coaxially aligning the tow with an adjacent separation layer and winding or wrapping the tow and separation layer onto a support structure in an interleaved manner so that the separation layer separates a wrap of the tow from an adjacent wrap of the tow. A coating can then be uniformly applied to the reinforcing fibers without defects caused by fiber tow to fiber tow contact. The separation layer can be a carbon fiber veil.

7 Claims, 1 Drawing Sheet

FIBER COATING METHOD

This application is a division of application Ser. No. 09/385,843, filed Aug. 30, 1999, U.S. Pat. No. 6,168,827, which is hereby incorporated by reference in its entirety.

This invention was made with government support under Contract No. DE-FC02-92-CE41000 awarded by the Department of Energy. The government may have certain rights to the invention.

BACKGROUND OF THE INVENTION

The invention relates to a method for applying a coating to a fiber by chemical vapor deposition (CVD).

Fiber reinforced ceramic matrix composites (CMCs) are formed of continuous uniaxial or woven fibers of ceramic material embedded in a ceramic matrix. These materials are designed to have a weak fiber-matrix bond strength so as to increase overall composite strength and toughness. When the CMC is loaded above a stress that initiates cracks in the matrix, the fibers debond from the matrix allowing fiber/matrix sliding without fiber fracture. The fibers can then bridge a matrix crack and transfer load to the surrounding matrix by transferring tensile stresses to frictional interfacial shear forces.

High temperature fiber reinforced CMCs have great potential for use in aircraft and gas turbine engines due to their high strength to weight ratio. The fibers may be in the form of individual filaments, as unidirectionally aligned fiber bundles or tows, or as woven, knitted or braided fabrics. A coating can be applied to the fibers for several purposes such as to protect them during composite processing, to modify fiber-matrix interface stresses and to promote or prevent mechanical and/or chemical bonding of the fiber and matrix. Chemical vapor deposition (CV3) is a common method for applying the fiber coatings.

The coatings must uniformly coat all fibers. While this may be possible when the fibers are individual filaments, it is very difficult to achieve when the fibers are collected into tows and woven, braided or knitted into fabrics. Adjacent and neighboring fibers block the flow of gaseous coating reactants to the fiber surfaces in the tow or cloth and block counterflow of reaction by-product gases away from the fibers. This is particularly true where fiber tows cross over or loop around each other as when mounted on a mandrel for CVD of a coating.

Chemical vapor deposition of a fiber coating is a time consuming and costly operation. The volume capacity of a CVD reactor is limited, and so to increase reactor throughput and decrease coating costs, as much fiber is packed into the reactor as possible for each coating deposition run. The packing of the fiber conflicts with the requirement of loosely arranging the fiber to allow for a uniform coating deposition.

Another problem related to uniformity of coating has to do with fiber-to-fiber and fiber-to-support contact. Any time a fiber is in direct physical contact with another body during coating deposition, the contact will interfere with the coating. Furthermore, contacting fibers are often "bonded" together by the coating deposited near a contact region. The coating in a bonded region is easily and commonly damaged when the fiber tow or cloth is removed from the support structure upon completion of the CVD. Consequently, as little physical fiber to fiber contact as possible is desired during coating deposition to minimize the amount of coating bonding and subsequent coating damage.

In one technique, many layers of fiber tow are overlapped onto a support structure such as a fixture, frame or mandrel to provide a high loading of fiber for the deposition furnace. Only part of the desired coating is deposited in a first run. The fiber tow is then removed from the deposition furnace and unwrapped from the support structure. The tow is then rewrapped onto the support structure, which is again loaded into the deposition furnace for a second run. This cycle is repeated several times for a thick coating. The unwrapping and rewrapping of the tow from the support structure is done to randomize contact points and tightly packed areas. The rewrapping method minimizes contact caused defects and non-uniformity caused by tight fiber packing. However, several coating runs are needed to adequately apply the fiber coating, thus reducing coating productivity and increasing coating costs.

Thus, there is a need to provide a method to coat the fibers of a wrapped tow in an efficient and effective manner.

SUMMARY OF THE INVENTION

The invention relates to a method for applying a coating to reinforcing fibers arranged into a tow. The tow is aligned with an adjacent separation layer and wound onto a support structure in an interleaved manner so that the separation layer separates a wrap of the tow from an adjacent wrap of the tow. A coating can then be uniformly applied to the reinforcing fibers without defects caused by fiber tow to fiber tow contact. The separation layer can comprise a carbon fiber veil.

In another aspect, the invention relates to wrapping a support structure with alternating layers of separation layer and tow of reinforcing fibers in an interleaved manner so that each wrap of tow is separated from each other wrap of tow. A coating is then applied onto the fibers of the tow in a chemical vapor deposition furnace.

Finally, the invention relates to a composition of matter, comprising a tow of reinforcing fibers and a separation layer with longitudinal axis in parallel alignment with a longitudinal axis of the tow. The tow and the separation layer are wound or wrapped together onto a support structure in an interleaved manner with the separation layer separating a wrap of the tow from an adjacent wrap of the tow.

DETAILED DESCRIPTION OF THE INVENTION

According to the present invention, a separation layer is used between layers of fiber in a CVD reactor to provide open space for the free flow of reactant gasses to and from the fibers. The separation layer has a minimal solid contact area with the fiber thus limiting coating defects caused by contact with fiber supports.

The material to be used as a separation layer is a porous non-woven "veil" or "tissue" of chopped fiber material, typically carbon. Carbon fiber veils produced by Technical Fibre Products. Ltd. of Slate Hill, N.Y. are examples of a suitable separation layer. These veils consist of fibers chopped to between 3 mm and 25 mm in length and formed into sheets of very low density, i.e. >95% porosity. According to the invention, the porosity of the veil is greater than 80% porosity, desirably greater than 90% and preferably greater than 95%. The veils can be made from a variety of organic, glass, ceramic or carbon fibers. Carbon is the preferred fiber in the veil because of its thermal stability and chemical inertness. Other fibers are suitable depending on the chemistry employed for the deposition of the specific coating.

Figure 1:
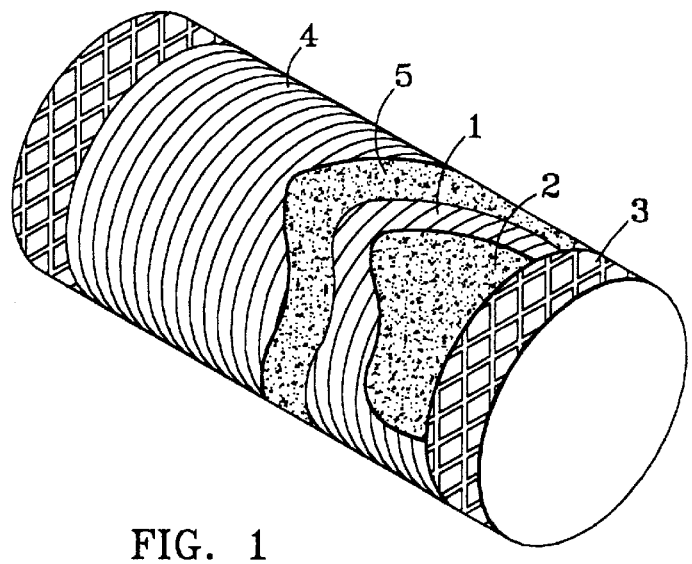
FIG. 1 of the drawing is a cut away perspective view of a layup of a fiber tow and a separation layer on a frustum-shaped support mandrel.

These and other features will become apparent from the detailed following discussion, which by way of example without limitation and with reference to the drawings describes preferred embodiments of the present invention FIG. 1 of the drawing is a perspective view of a layup of a fiber tow 1 and a separation layer 2 on a support structure 3. The support structure 3 can be a fixture or frame. In FIG. 1, the support structure is a screen mandrel and the separation layer 2 is a carbon veil. FIG. 1 is shown cut away to display the fiber tow 1 and separation layer 2. FIG. 1 shows the mandrel as a frustum-shaped structure to facilitate helical wrapping of tow and veil. Helical wrapping prevents tow end contact with the mandrel or with another tow.

A first layer of veil 2 is wrapped over the mandrel 3 surface. The fiber tow 1 is then wrapped over the veil 2 in a helical pattern with a minimum of free space between each tow 1 of about ½ the tow width. A second layer 4 of veil is then wrapped over the fiber tow 1 followed by another layer 5 of fiber tow. While the FIG. 1 shows only a few layers of wrapping, in practice, any number of turns can be wound onto the mandrel 3.

Figure 2:
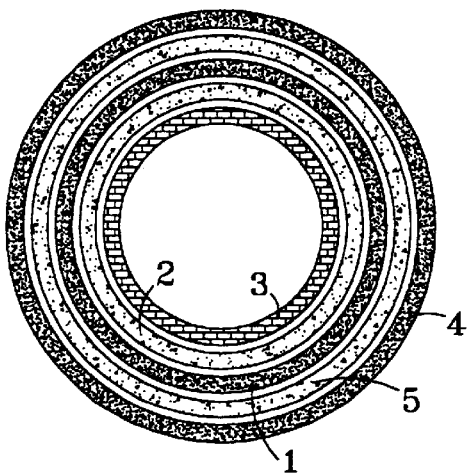
FIG. 2 is a end view of the mandrel with wrapped separation layer and fiber tow.

FIG. 2 is an end view of the support structure looking down along the support structure's longitudinal axis. FIG. 2 shows two wrapped layers of veil 2, 5 and fiber tow 1, 4.

Figure 3:
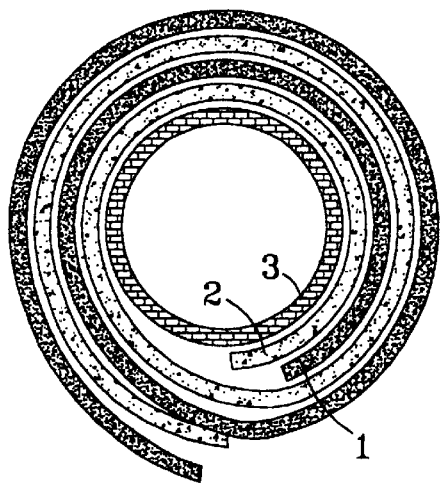
FIG. 3 is an end view of the mandrel with wound separation layer and fiber tow.

FIG. 3 is an end view of the frustum-shaped support structure 3 for helical wrapping. In FIG. 3, the fiber tow is a continuous cloth that is spiral or helically wrapped on the mandrel 3 to assure that the cloth is always separated from adjacent fiber layers. The tow 1 is first aligned with the separation layer 2 with its longitudinal axis parallel with the longitudinal axis of the adjacent separation 2. The tow 1 and separation layer 2 are wound onto the frustum-shaped mandrel 3 in an interleaved manner so that the separation layer 2 separates a wrap of the tow 1 from an adjacent wrap 4 of the tow The frustum-shaped mandrel 3 can be mounted onto a center rod or turret within a chemical vapor deposition furnace. The CVD furnace typically is a closed cylindrical graphite reactor. The substrates to be coated are held in place inside the reactor with support structures according to the present invention. After heating the substrate and interior of the reactor to a reaction temperature between about 700° C. and about 1500° C., reactant gases are admitted to the bottom of the reactor. The reactant gases flow axially upwardly through the reactor to coat the substrate fixed on the support structure. The porosity of the interleaved carbon veil 2 allows improved vapor access to the tow 1, while at the same time the veil 2 separates wraps or windings of the tow 1 from the mandrel 3 and from other tow wraps and windings.

While preferred embodiments of the invention have been described, the present invention is capable of variation and modification and therefore should not be limited to the precise details of the examples. The invention includes changes and alterations that fall within the purview of the following claims.

What is claimed:

1. An article, comprising a tow of reinforcing fibers and a separation layer with longitudinal axis in parallel alignment with a longitudinal axis of said tow, said tow and said separation layer wound or wrapped together onto a support structure in an interleaved manner with said separation layer separating a wrap of said tow from an adjacent wrap of said tow, and wherein said separation layer comprises a greater than 80% porosity, non-woven veil of fibers chopped to between 3 mm and 25 mm in length, and further wherein said tow and separation layers are helically wound onto said frustum-shaped mandrel.

2. The article of claim 1, wherein said separation layer comprises a carbon fiber veil.

3. The article of claim 1, wherein said separation layer comprises a carbon veil having a porosity of at least about 85%.

4. The article of claim 1, wherein said separation layer comprises a carbon veil having a porosity of at least about 90%.

5. The article of claim 1, wherein said separation layer comprises a carbon veil having a porosity of at least about 95%.

6. The article of claim 1, wherein said support structure is a frustum-shaped mandrel.

7. The article of claim 1, wherein said frustum-shaped mandrel is mounted onto a center rod or turret within a chemical vapor deposition furnace.

* * * * *